United States Patent
Chen et al.

(10) Patent No.: US 10,361,681 B2
(45) Date of Patent: Jul. 23, 2019

(54) MOVING AVERAGE LOW-PASS FILTERING DEVICE AND METHOD

(71) Applicant: Chung Yuan Christian University, Taoyuan (TW)

(72) Inventors: Shih-Lun Chen, Taoyuan (TW); Ting-Lan Lin, Taoyuan (TW); Wen-Xuan Zhao, Taoyuan (TW)

(73) Assignee: Chung Yuan Christian University (TW)

( * ) Notice: Subject to any disclaimer, the term of this patent is extended or adjusted under 35 U.S.C. 154(b) by 110 days.

(21) Appl. No.: 15/726,357

(22) Filed: Oct. 5, 2017

(65) Prior Publication Data

US 2018/0331673 A1 Nov. 15, 2018

(30) Foreign Application Priority Data

May 12, 2017 (TW) .............................. 106115734 A

(51) Int. Cl.
| | | |
|---|---|---|
| *H03H 17/02* | (2006.01) | |
| *G06F 17/12* | (2006.01) | |
| *G06F 5/01* | (2006.01) | |
| *G06F 7/50* | (2006.01) | |
| *G06F 7/544* | (2006.01) | |
| *H03H 17/04* | (2006.01) | |

(52) U.S. Cl.
CPC ............. *H03H 17/026* (2013.01); *G06F 5/01* (2013.01); *G06F 7/50* (2013.01); *G06F 7/544* (2013.01); *G06F 17/12* (2013.01); *H03H 17/0223* (2013.01); *H03H 17/04* (2013.01); *H03H 2218/10* (2013.01)

(58) Field of Classification Search
None
See application file for complete search history.

(56) References Cited

U.S. PATENT DOCUMENTS

| | | | | |
|---|---|---|---|---|
| 5,068,818 A | * | 11/1991 | Uramoto | G01R 19/003 |
| | | | | 702/199 |
| 5,440,503 A | * | 8/1995 | Maruyama | H03H 17/0657 |
| | | | | 341/143 |
| 5,708,596 A | * | 1/1998 | Sato | G06F 17/10 |
| | | | | 708/313 |
| 6,304,133 B1 | * | 10/2001 | Sato | H03H 17/026 |
| | | | | 327/551 |

* cited by examiner

*Primary Examiner* — Michael D. Yaary

(57) ABSTRACT

Differing from the fact that the amount of register units and adder units arranged in conventional moving average filter must be increased for processing more number of reference input signals, the present invention particularly discloses a moving average low-pass filtering device. The moving average low-pass filtering device comprises a register unit and a filtering and processing unit, and is able to use identical circuit architecture to successfully treat reference input signals with a filtering process even if the number of the reference input signals is alternatively increased. Moreover, after finishing a verification experiment by a simulator, simulation results have proved that, this novel moving average low-pass filtering device still can use identical circuit architecture to complete the filtering process under nearly the same calculation efficiency even though the number of the reference input signals is alternatively increased.

9 Claims, 4 Drawing Sheets

MOVING AVERAGE LOW-PASS FILTERING DEVICE AND METHOD

BACKGROUND OF THE INVENTION

1. Field of the Invention

The present invention relates to the technology field of electronic circuits, and more particularly to a moving average low-pass filtering device and a moving average low-pass filtering method capable of utilizing identical circuit architecture to successfully treating reference input signals with a filtering process even if the number of the reference input signals is alternatively increased.

2. Description of the Prior Art

Low-pass filter is a filter capable of passing signals with a frequency lower than a cut-off frequency and attenuating signals with frequencies higher than the cut-off frequency. In addition, low-pass filter is sometimes called high-cut filter or treble-cut filter when being implemented in an audio circuit.

Moving average filter, one type of low-pass filter, is configured to filter out high-frequency noises from input signals so as to smooth the input signals. Moving average filters are widely applied in various technology fields nowadays, such as wearable electronic devices, IoT and biomedical devices. FIG. 1 shows a circuit framework diagram of a conventional moving average filter. The conventional moving average filter 1' comprises a plurality of register units 11', a plurality of adder units 12' and a shifter unit 13'. It is worth noting that, the moving average filter 1' can be implemented in an application circuit for processing 16 input signals because the amount of the register units 11' and the adder unit 12' is respectively sixteen and fifteen.

Electronic engineers skilled in development and manufacture of the moving average filter 1' should know that, the amount of the register units 11' and the adder unit 12' arranged in the moving average filter 1' is determined based on the number of reference input signals temporarily stored in the register units 11'. Therefore, it is understood that the hardware amount and whole cost of the moving average filter 1' grow with the increase of the number of the reference input signals.

From above descriptions, it is clear that the conventional approach for planning and arranging related hardware units to constitute the moving average filter 1' is inflexible and not very intelligent. Therefore, how to find an ideal approach for effectively solving the problem on hardware designs of the conventional moving average filter 1' has become the most important study issue. In view of that, inventors of the present application have made great efforts to make inventive research thereon and eventually provided a moving average low-pass filtering device and a moving average low-pass filtering method.

SUMMARY OF THE INVENTION

In view of the fact that the number of register units and adder units arranged in conventional moving average filter must be increased for processing more number of reference input signals, the primary objective of the present invention is to provide a moving average low-pass filtering device and a moving average low-pass filtering method, wherein the moving average low-pass filtering device is able to successfully treat reference input signals with a filtering process even if the number of the reference input signals is alternatively increased, without being added any additional register units and adder units into the circuit architecture thereof. Moreover, after finishing a verification experiment by a simulator, simulation results have proved that, this novel moving average low-pass filtering device still can use identical circuit architecture to complete the filtering process under nearly the same calculation efficiency even though the number of the reference input signals is alternatively increased. Therefore, it is easy to know that this novel moving average low-pass filtering device shows a variety of advantages, including: (1) being capable of successfully treating reference input signals with a filtering process even if the number of the reference input signals is increased, and (2) being able to use identical circuit architecture to complete the filtering process.

In order to achieve the primary objective of the present invention, the inventor of the present invention provides an embodiment for the moving average low-pass filtering device, which is electrically connected between a signal providing device and an electronic device, and used for receiving successive input signals from the signal providing device and subsequently apply a filtering process to the successive input signals, so as to correspondingly output successive signals to the electronic device; moreover, the embodiment of the moving average low-pass filtering device comprises:

a register unit for temporarily storing the successive input signals; and a filtering and processing unit, being configured to access the successive input signals from the register unit so as to subsequently apply at least one shift process, at least one subtracting process, and at least one adding process to the successive input signals.

Moreover, for achieving the primary objective of the present invention, the inventor of the present invention further provides an embodiment for the moving average low-pass filtering method, which is implemented in an execution device, wherein the execution device is electrically connected between a signal providing device and an electronic device, and used for receiving successive input signals from the signal providing device and subsequently apply a filtering process to the successive input signals, so as to correspondingly output successive signals to the electronic device; moreover, the embodiment of the moving average low-pass filtering method comprises following steps:

(1) providing a register unit and a filtering and processing unit in the execution device;

(2) letting the register unit receive successive input signals from a memory, a storing device or the signal providing device; and (3) using the filtering and processing unit to access the successive input signals from the register unit, so as to subsequently apply at least one shift process, at least one subtracting process, and at least one adding process to the successive input signals.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a moving average low-pass filtering device and a moving average low-pass filtering method according to the present invention, embodiments of the present invention will be described in detail with reference to the attached drawings hereinafter.

Figure 2:
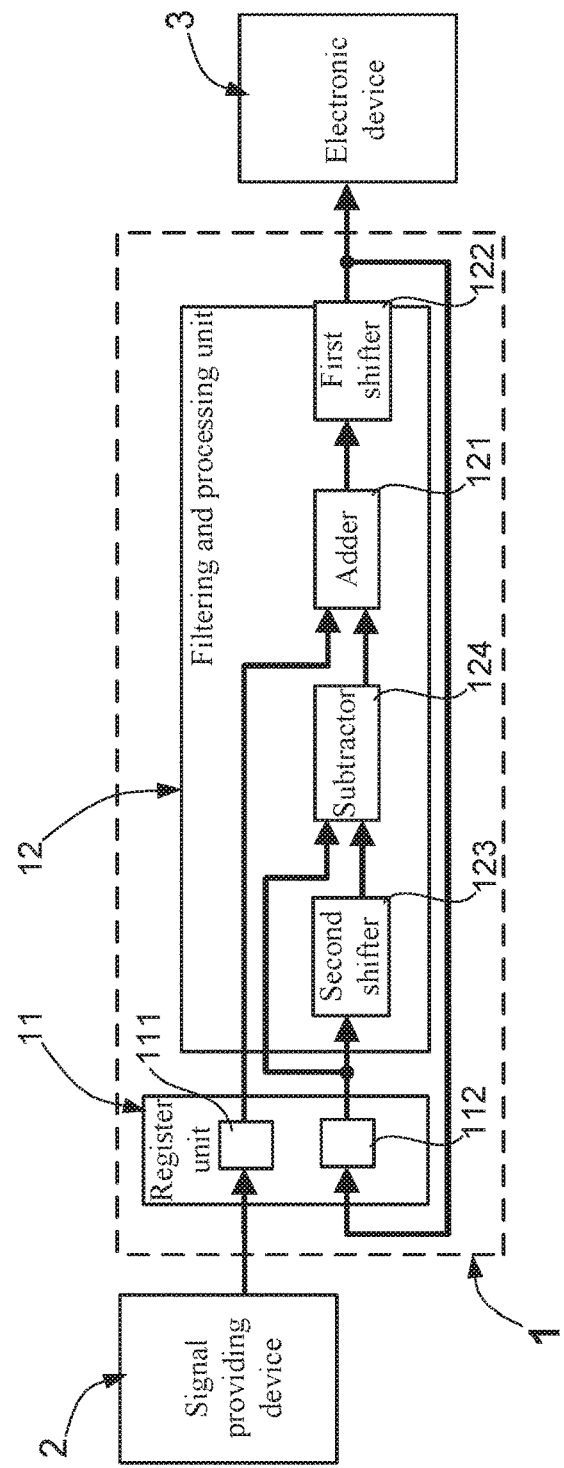
FIG. 2 shows a circuit framework diagram of a moving average low-pass filtering device according to the present invention.

With reference to FIG. 2, which illustrate a circuit framework diagram of a moving average low-pass filtering device according to the present invention. As FIG. 2 shows, the moving average low-pass filtering device 1 is electrically connected between a signal providing device 2 and an electronic device 3, and used for receiving successive input signals from the signal providing device 2 and subsequently apply a filtering process to the successive input signals, so as to correspondingly output successive signals to the electronic device 3. It needs to further explain that the said signal providing device 2 can be an A/D converter, a sensor, a receiver, a voice recognition device, a memory, a storing device, or digital a signal outputting device. On the other hand, the electronic device 3 can be a dynamic random access memory (DRAM), a universal serial bus (USB), a wired transmission device, a wireless transmission device, or a data storing device.

From FIG. 2, it is found that the moving average low-pass filtering device 1 of the present invention merely comprises a register unit 11 and a filtering and processing unit 12, wherein the register unit 11 is used for temporarily storing successive input signals outputted by the signal providing device 2. Moreover, the filtering and processing unit 12 is configured to access the successive input signals from the register unit 11 so as to subsequently apply at least one shift process, at least one subtracting process, and at least one adding process to the successive input signals.

In the present invention, the register unit 11 is constituted by a first register 111 and a second register 112. It is worth explaining that, after the filtering and processing unit 12 applies a moving average process to one specific input signal of the successive input signals stored in the first register 111, the second register 112 would subsequently store the specific input signal as another one input signal. Therefore, according to a system clock signal, the input signal stored in the second register 112 and the input signal stored in the first register 111 are respectively regarded as an (N−1)-th input signal been treated with the moving average process and an N-th input signal.

Please refer to FIG. 2 again. The filtering and processing unit 12 comprises an adder 121, a first shifter 122, a second shifter 123, and a subtractor 124. When the filtering and processing unit 12 normally works, the N-th input signal of the successive input signals would be treated with an adding process by the adder 12 electrically connected to the first register 111 and the subtractor 124. Subsequently, the first shifter 122 electrically connected to the adder 122 applies a first shift process to the N-th input signal been treated with the adding process, and then the second register 112 stores the N-th input signal been treated with first shift process as one (N−1)-the input signal.

After finishing the adding process, the second shifter continuously applies a second shift process to the (N−1)-the input signal stored in the second register 112. Furthermore, since the subtractor 124 is electrically connected to the second shifter 123 and the second register 112, the subtractor 124 is configured to apply a subtracting process to the (N−1)-the input signal been treated with the second shift process and the (N−1)-the input signal. Consequently, the adder 121 applies the adding process to an output signal of the subtractor 124 and the N-th input signal.

In is worthy particularly introducing that, the technology features of this moving average low-pass filtering device 1 for carrying out moving average filtering process include: (1) to amplify a previous input signal (i.e., the (N−1)-th input signal) stored in the second register 112 by $2^n$ times through using the second shifter 123 to leftward shifting decimal (binary) data of the (N−1)-th input signal by n bits based on system clock signal; and (2) applying a subtracting process to the (N−1)-th input signal been amplified by $2^n$ times and the (N−1)-th input signal by using the subtractor 124, so as to obtain one (N−1)-th input signal been amplified by $2^{n-1}$ times. Thus, a digital signal can be produced by adding the (N−1)-th input signal been amplified by $2^{n-1}$ times and the N-th input signal, wherein the said digital signal is approximately equal to the superposition of first input signal, second input signal, $3^{rd}$ input signal, . . . , and $(2^n)$-th input signal. Eventually, the N-th input signal been treated with the moving average process can be obtained through using the first shifter 122 to rightward shift decimal (binary) data of the digital signal outputted from the adder 122 (i.e., the N-th input signal) by n bits.

Figure 1:
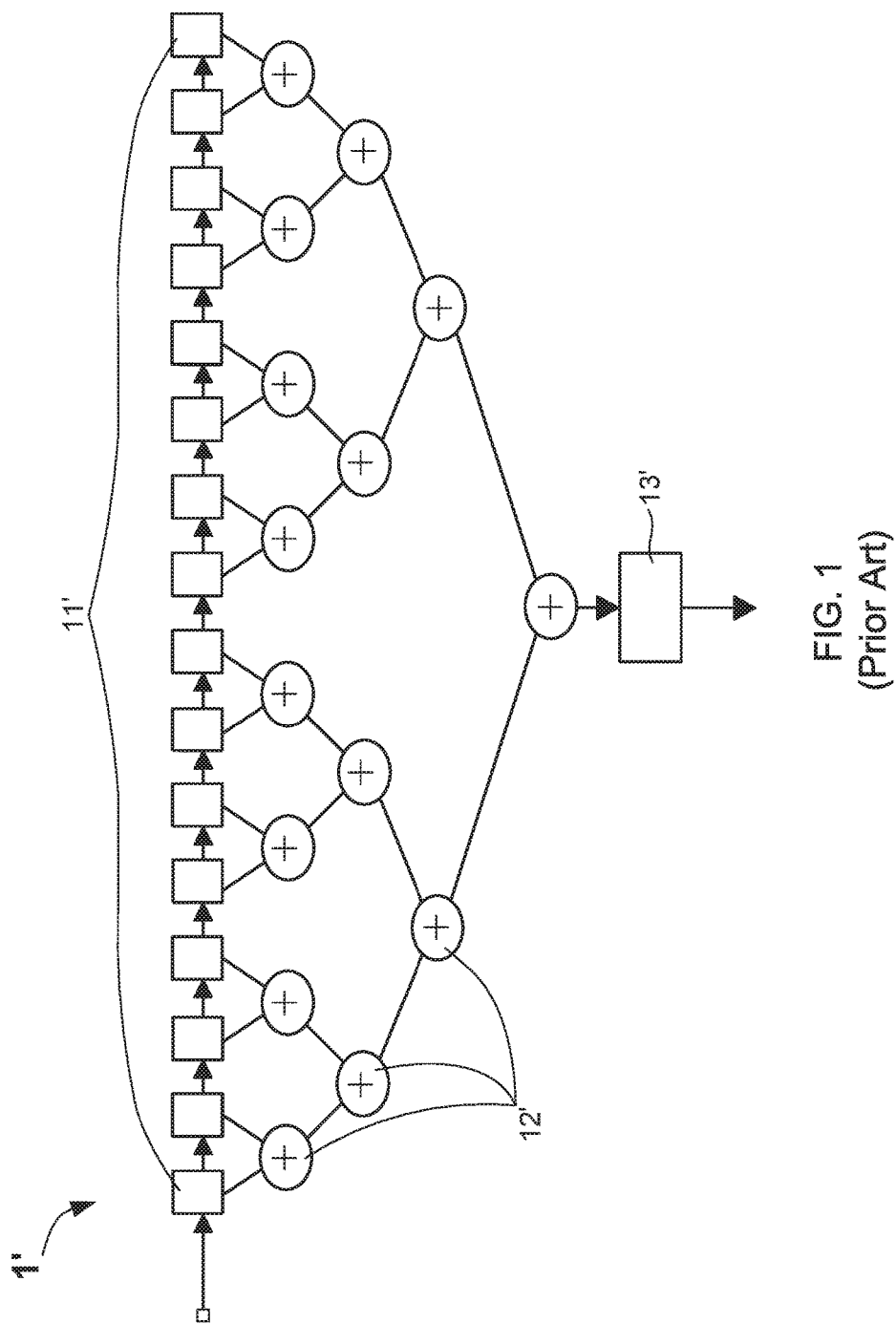
FIG. 1 shows a circuit framework diagram of a conventional moving average filter.

Compared to the conventional moving average filter 1' shown in FIG. 1, the moving average low-pass filtering device 1 proposed by the present invention exhibits a primary advantage of being able to use identical circuit architecture to successfully treat successive input signals with a moving average filtering process even if the number of the input signals is alternatively increased. Moreover, in order to prove the practicability of the proposed moving average low-pass filtering device 1, simulator is adopted for carrying out at least one verification experiment. Related experimental data are integrated in following Table (1) and Table (2).

TABLE (1)

| | Number of input signals | | | | | |
|---|---|---|---|---|---|---|
| | 2 | 4 | 8 | 16 | 32 | 64 |
| Amount of adders and subtractors | 1 | 3 | 7 | 15 | 31 | 63 |
| Amount of shifters | 1 | 1 | 1 | 1 | 1 | 1 |
| Amount of registers | 3 | 5 | 9 | 17 | 33 | 65 |
| Calculation time (ns) | 4.96 | 5 | 5 | 5.47 | 6.28 | 7.08 |

TABLE (2)

| | Number of input signals | | | | | |
|---|---|---|---|---|---|---|
| | 2 | 4 | 8 | 16 | 32 | 64 |
| Amount of adders and subtractors | 2 | 2 | 2 | 2 | 2 | 2 |

TABLE (2)-continued

|  | Number of input signals | | | | | |
|---|---|---|---|---|---|---|
|  | 2 | 4 | 8 | 16 | 32 | 64 |
| Amount of shifters | 2 | 2 | 2 | 2 | 2 | 2 |
| Amount of registers | 2 | 2 | 2 | 2 | 2 | 2 |
| Calculation time (ns) | 4.99 | 5 | 5 | 5 | 5 | 5 |

From Table (1) and FIG. 1, it is found that the amount the amount of the register units 11' and the adder unit 12' arranged in the moving average filter 1' is determined based on the number of reference input signals. Thus, it is understood that, the hardware amount and whole cost of the moving average filter 1' grow with the increase of the number of the reference input signals. However, it is worth noting that, the calculation time of the moving average filter's does not be correspondingly reduced with the increase of the hardware units; on the contrary, the calculation time grows. On the other hand, Table (2) and FIG. 2 indicate that this novel moving average low-pass filtering device 1 can use identical circuit architecture to apply moving average filtering process to successive input signals even if the number of the input signals is alternatively increased. Moreover, experimental data also proved that, the moving average low-pass filtering device 1 of the present invention shows almost the same calculation performance when processing different numbers of successive input signals.

It needs to emphasize that, although FIG. 2 indicates that the moving average low-pass filtering device 1 of the present invention is a hardware circuit, that does not used for limiting the implementation type of the moving average low-pass filtering device 1. Engineers skilled in development of digital filter program should know that, the digital filter can also be established by using mathematical algorithms, so as to be provided in an execution device like computer, processor or controller by a form of application program, library, variables, or operands. Accordingly, the present invention simultaneously provides a moving average low-pass filtering method capable of being implemented in an execution device, wherein the execution device is electrically connected between the signal providing device 2 and the electronic device 3, and used for receiving successive input signals from the signal providing device 2 and subsequently apply a filtering process to the successive input signals, so as to correspondingly output successive signals to the electronic device 3.

Figure 3:
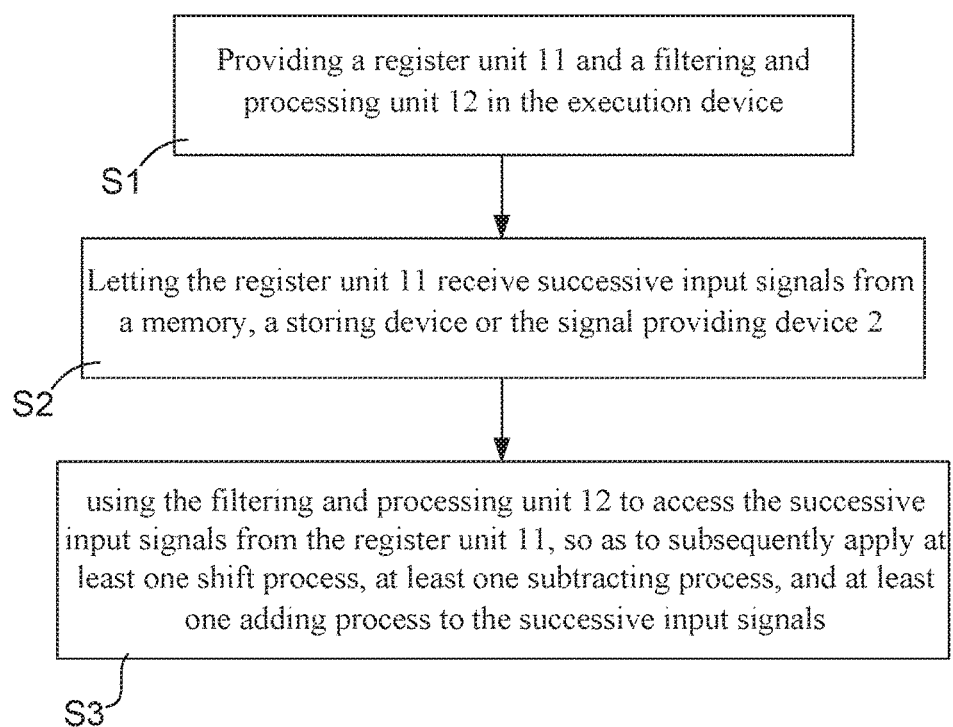
FIG. 3 shows a flow chart of a moving average low-pass filtering method according to the present invention.

Please refer to FIG. 3, where a flow chart of the moving average low-pass filtering method proposed by the present invention is provided. As FIG. 3 shows, the moving average low-pass filtering method mainly comprises 3 steps of:

step (S1): providing a register unit 11 and a filtering and processing unit 12 in the execution device;

step (S2): letting the register unit 11 receive successive input signals from a memory, a storing device or the signal providing device 2; and step (S3): using the filtering and processing unit 12 to access the successive input signals from the register unit 11, so as to subsequently apply at least one shift process, at least one subtracting process, and at least one adding process to the successive input signals.

Figure 4:
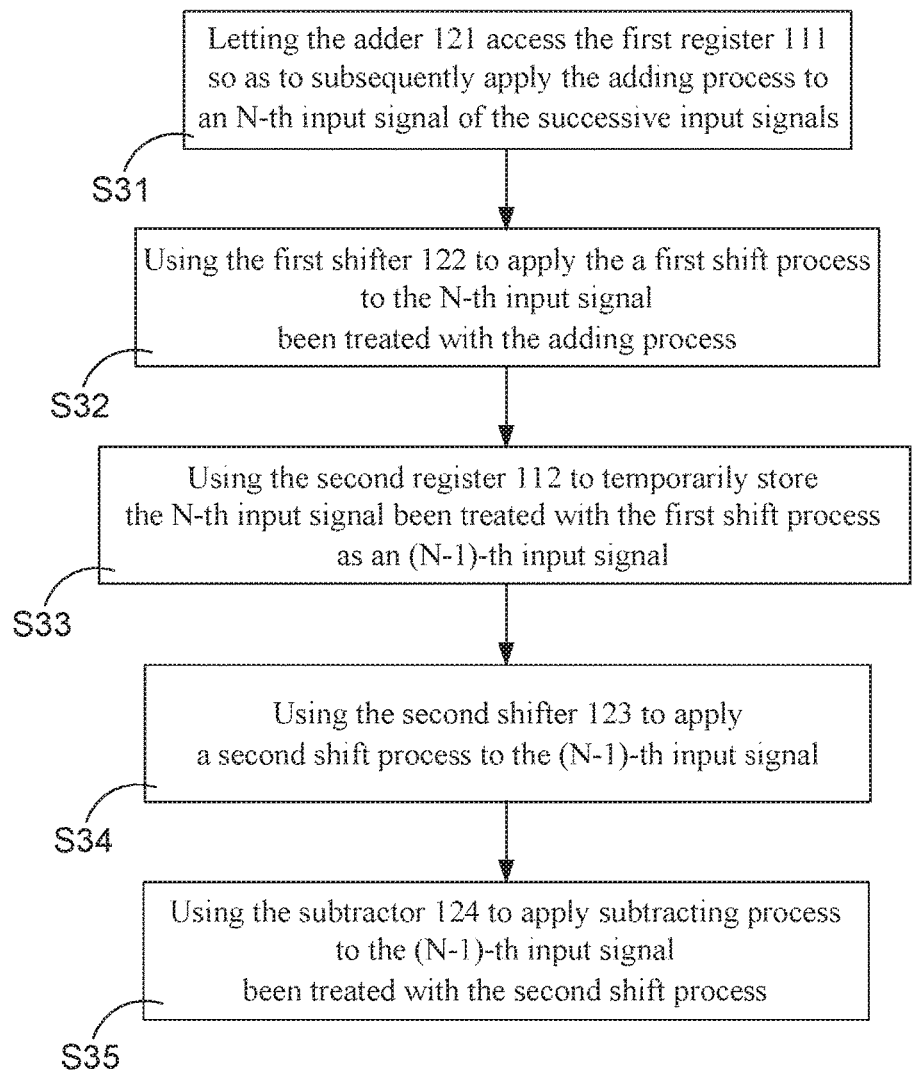
FIG. 4 shows a flow chart for describing detail steps of step (3).

Continuously referring to FIG. 2, and please simultaneously refer to FIG. 4, which illustrate a flow chart for describing detail steps of the step (3). The step (3) of the moving average low-pass filtering method comprises following detailed steps:

step (S31): letting the adder 121 access the first register 111, so as to subsequently apply the adding process to an N-th input signal of the successive input signals;

step (S32): using the first shifter 122 to apply the a first shift process to the N-th input signal been treated with the adding process;

step (S33): using the second register 112 to temporarily store the N-th input signal been treated with the first shift process as an (N−1)-th input signal;

step (S34): using the second shifter 123 to apply a second shift process to the (N−1)-th input signal; and step (S35): using the subtractor 124 to apply the subtracting process to the (N−1)-th input signal been treated with the second shift process, wherein the adder 121 is configured to apply the adding process to an output signal of the subtractor 124 and the N-th input signal.

Therefore, through above descriptions, the moving average low-pass filtering device and method proposed by the present invention have been introduced completely and clearly; in summary, the present invention includes the advantages of:

(1) In view of the fact that the number of register units 11' and adder units 12' arranged in conventional moving average filter 1' (shown as FIG. 1) must be increased for processing more number of reference input signals, the present invention particularly provides a moving average low-pass filtering device 1, which is able to successfully treat reference input signals with a filtering process even if the number of the reference input signals is alternatively increased, without being added any additional register units and adder units into the circuit architecture thereof. Moreover, after finishing a verification experiment by a simulator, simulation results have proved that, this novel moving average low-pass filtering device still can use identical circuit architecture to complete the filtering process under nearly the same calculation efficiency even though the number of the reference input signals is alternatively increased. Therefore, it is easy to know that this novel moving average low-pass filtering device shows a variety of advantages, including: (1) being capable of successfully treating reference input signals with a filtering process even if the number of the reference input signals is increased, and (2) being able to use identical circuit architecture to complete the filtering process (2) In addition, this moving average low-pass filtering device 1 can also be established through using mathematical algorithms, so as to be provided in an execution device like computer, processor or controller by a form of application program, library, variables, or operands.

The above description is made on embodiments of the present invention. However, the embodiments are not intended to limit scope of the present invention, and all equivalent implementations or alterations within the spirit of the present invention still fall within the scope of the present invention.

What is claimed is:

1. A moving average low-pass filtering device, being electrically connected between a signal providing device and an electronic device, and used for receiving successive input signals from the signal providing device and subsequently apply a filtering process to the successive input signals, so as to correspondingly output successive signals to the electronic device; moreover, the moving average low-pass filtering device comprising:

a register unit, comprising a first register for temporarily storing the successive input signals and a second register; and a filtering and processing unit, comprising:
   an adder, being coupled to the first register for applying an adding process to an N-th input signal of the successive input signals;
   a first shifter, being coupled to the adder and the second register of the register unit, and being configured for applying a first shift process to the N-th input signal that is been treated with the adding process, and the second register temporarily storing the N-th input signal as a (N−1)-th input signal;
   a second shifter, being coupled to the second register of the register unit for applying a second shift process to the (N−1)-th input signal; and
   a subtractor, being electrically connected to the second shifter and the second register of the register unit, and being configured to apply a subtracting process to the (N−1)-th input signal and the (N−1)-th input signal that is been treated with the second shift process;
   wherein the adder is also coupled to the subtractor, such that an output signal of the subtractor and the N-th input signal are applied with the adding process by the adder.

2. The moving average low-pass filtering device of claim 1, wherein the signal providing device is selected from the group consisting of A/D converter, sensor, receiver, voice recognition device, memory, storing device, and digital signal outputting device.

3. The moving average low-pass filtering device of claim 1, wherein the electronic device is selected from the group consisting of dynamic random access memory (DRAM), universal serial bus (USB), wired transmission device, wireless transmission device, and data storing device.

4. A moving average low-pass filtering method, being implemented in an execution device, wherein the execution device is electrically connected between a signal providing device and an electronic device, and used for receiving successive input signals from the signal providing device and subsequently apply a filtering process to the successive input signals, so as to correspondingly output successive signals to the electronic device; moreover, the moving average low-pass filtering method comprising following steps:
   (1) providing a register unit and a filtering and processing unit in the execution device; wherein the register unit comprises a first register and a second register, and the filtering and processing unit comprising a first shifter, a second shifter, and a subtractor;
   (2) letting the register unit receive successive input signals from a memory, a storing device or the signal providing device through the first register thereof;
   (31) letting the adder access the first register, so as to apply an adding process to an N-th input signal of the successive input signals;
   (32) using the first shifter to apply the a first shift process to the N-th input signal that is been treated with the adding process;
   (33) using the second register to temporarily store the N-th input signal that is been treated with the first shift process as an (N−1)-th input signal;
   (34) using the second shifter to apply a second shift process to the (N−1)-th input signal; and
   (35) using the subtractor to apply the subtracting process to the (N−1)-th input signal that is been treated with the second shift process;
   wherein the adder is configured to apply the adding process to an output signal of the subtractor and the forgoing N-th input signal.

5. The moving average low-pass filtering method of claim 4, wherein the signal providing device is selected from the group consisting of A/D converter, sensor, receiver, voice recognition device, memory, storing device, and digital signal outputting device.

6. The moving average low-pass filtering method of claim 4, wherein the electronic device is selected from the group consisting of dynamic random access memory (DRAM), universal serial bus (USB), wired transmission device, wireless transmission device, and data storing device.

7. The moving average low-pass filtering method of claim 4, wherein the execution device is selected from the group consisting of computer, processor and controller.

8. The moving average low-pass filtering method of claim 4, wherein both the register unit and the filtering and processing unit are provided in the execution device by a form of application program, library, variables, or operands.

9. The moving average low-pass filtering method of claim 4, wherein the first shift process is carried out after rightward shifting decimal (binary) data of the N-th input signal that is been treated with the adding process by n bits based on a system clock signal, and the first shift process being completed after leftward shifting decimal (binary) data of the (N−1)-th input signal by n bits based on the system clock signal.

* * * * *